United States Patent
Joos et al.

(10) Patent No.: US 8,508,259 B2
(45) Date of Patent: Aug. 13, 2013

(54) METHOD FOR DRIVING NON-LINEAR LOAD ELEMENTS BASED ON LOAD CURRENT

(75) Inventors: Uli Joos, Nonnenhorn (DE); Jochen Zwick, Markdorf (DE); Josef Schnell, Wasserburg (DE); Christian Voss, Salem (DE)

(73) Assignee: Conti Temic microelectronic GmbH (DE)

( * ) Notice: Subject to any disclaimer, the term of this patent is extended or adjusted under 35 U.S.C. 154(b) by 472 days.

(21) Appl. No.: 12/675,239

(22) PCT Filed: Aug. 23, 2008

(86) PCT No.: PCT/DE2008/001391
§ 371 (c)(1),
(2), (4) Date: Jul. 28, 2010

(87) PCT Pub. No.: WO2009/026896
PCT Pub. Date: Mar. 5, 2009

(65) Prior Publication Data
US 2010/0308786 A1  Dec. 9, 2010

(30) Foreign Application Priority Data
Aug. 28, 2007 (DE) .......... 10 2007 040 783

(51) Int. Cl.
*H03K 3/00* (2006.01)
(52) U.S. Cl.
USPC ............... 327/108; 327/110; 326/83
(58) Field of Classification Search
USPC ............... 327/108, 110; 326/82, 83
See application file for complete search history.

(56) References Cited

U.S. PATENT DOCUMENTS

| | | | | |
|---|---|---|---|---|
| 5,057,760 A | * | 10/1991 | Dadpey et al. | 318/807 |
| 5,341,454 A | * | 8/1994 | Orii | 388/815 |
| 5,627,710 A | * | 5/1997 | Schoeffler | 361/23 |
| 5,801,458 A | | 9/1998 | Marks | |
| 5,875,414 A | * | 2/1999 | Tsutsumi | 702/99 |

(Continued)

FOREIGN PATENT DOCUMENTS

| DE | 44 13 546 | 10/1995 |
|---|---|---|
| DE | 199 00 383 | 7/1999 |

(Continued)

OTHER PUBLICATIONS

International Search Report for PCT/DE2008/001391 dated Dec. 15, 2008.

*Primary Examiner* — Kenneth B. Wells
(74) *Attorney, Agent, or Firm* — RatnerPrestia (57) ABSTRACT

A method for driving a non-linear load element. On account of the non-linear interrelationship between the voltage and the current at the load element and the related non-linear dependence of the power loss on the quantities "voltage" and "current", an adjustment of the switching speed only on the basis of the power loss in the switching element cannot be carried out with non-linear load elements without being confronted with undesirable switching losses and related electromagnetic noise fields. Therefore, the load current currently flowing in the load element is picked up in addition to the currently determined power loss in the switching element, and the switching speed of the switching element is controlled in dependence on the determined power loss and on the current picked up. The switching speed can be optimally adjusted when driving the non-linear load elements by means of PWM.

21 Claims, 11 Drawing Sheets

(56) References Cited

U.S. PATENT DOCUMENTS

| | | | |
|---|---|---|---|
| 6,341,073 B1 * | 1/2002 | Lee | 363/21.02 |
| 6,690,137 B2 * | 2/2004 | Iwaji et al. | 318/700 |
| 7,006,933 B2 * | 2/2006 | Miyamoto | 702/60 |
| 7,034,600 B2 | 4/2006 | Scheikl | |
| 7,417,473 B2 | 8/2008 | Kawamoto | |
| 7,558,094 B2 * | 7/2009 | Inoshita et al. | 363/132 |
| 2001/0040470 A1 | 11/2001 | Brando et al. | |
| 2004/0085117 A1 | 5/2004 | Melbert et al. | |
| 2005/0206438 A1 | 9/2005 | Higashi | |
| 2007/0103133 A1 | 5/2007 | Joos et al. | |

FOREIGN PATENT DOCUMENTS

| | | |
|---|---|---|
| DE | 198 48 829 | 5/2000 |
| DE | 198 55 604 | 6/2000 |
| DE | 101 43 432 | 2/2003 |
| DE | 102 17 611 | 11/2003 |
| DE | 102 40 167 | 3/2004 |
| DE | 10 2006 024 951 | 12/2006 |
| WO | WO 2005/057788 | 6/2005 |

* cited by examiner

Figure 1

Prior Art

Figure 10c

METHOD FOR DRIVING NON-LINEAR LOAD ELEMENTS BASED ON LOAD CURRENT

CROSS-REFERENCE TO RELATED APPLICATIONS

This application is the U.S. national phase application of PCT International Application No. PCT/DE2008/001391, filed Aug. 23, 2008, which claims priority to German Patent Application No. DE 10 2007 040 783.3, filed Aug. 28, 2007, the contents of such applications being incorporated herein by reference.

FIELD OF THE INVENTION

The invention relates to a method for driving a non-linear load element.

BACKGROUND OF THE INVENTION

Many electric load elements, particularly electric load elements in motor vehicles, such as lamps, heating spirals etc., are driven by means of pulse-width modulation (PWM), wherein the power delivered to the load element can be regulated or controlled, wherein it is possible to minimize the losses in the drive electronics by the switching operations.

However, when driving load elements in motor vehicles by means of pulse-width modulation, electromagnetic fields that may interfere with the radio reception in the vehicle are emitted via the battery supply lines and the load supply lines. Therefore, appropriate limiting values have been laid down in various standards, such as IEC, ISO, CISPR, said limiting values reducing the interference with the radio receiver in the corresponding spectra to a tolerable degree. These emitted fields may be reduced by filtering at the inputs and outputs of the control device, for example. The new methods actively influence the switching edges, as it is described in the unexamined application WO2005/057788, for example, which is incorporated by reference.

In the new series of vehicles, the lamps are being increasingly replaced by light emitting diodes (LED). However, the non-linearity of their current-voltage characteristic results in a sudden break-off of the current and so in increased interfering emissions.

Conventional methods attenuate the high-frequency alternating currents in the supply lines by means of filters in the input lines and output lines. However, the disadvantage of the filters consists in the fact that they are very expensive and require a lot of space, whereby they raise the price of the electronic components, and that they cannot be miniaturized (integration in silicon).

Another possibility of reducing electromagnetic radiation is the reduction of the switching speed in the switching element, whereby the high-frequency current portions can be reduced to the necessary degree, but here the undesirable switching losses heating up the electronic components are increasing with decreasing switching speed.

Figure 1:
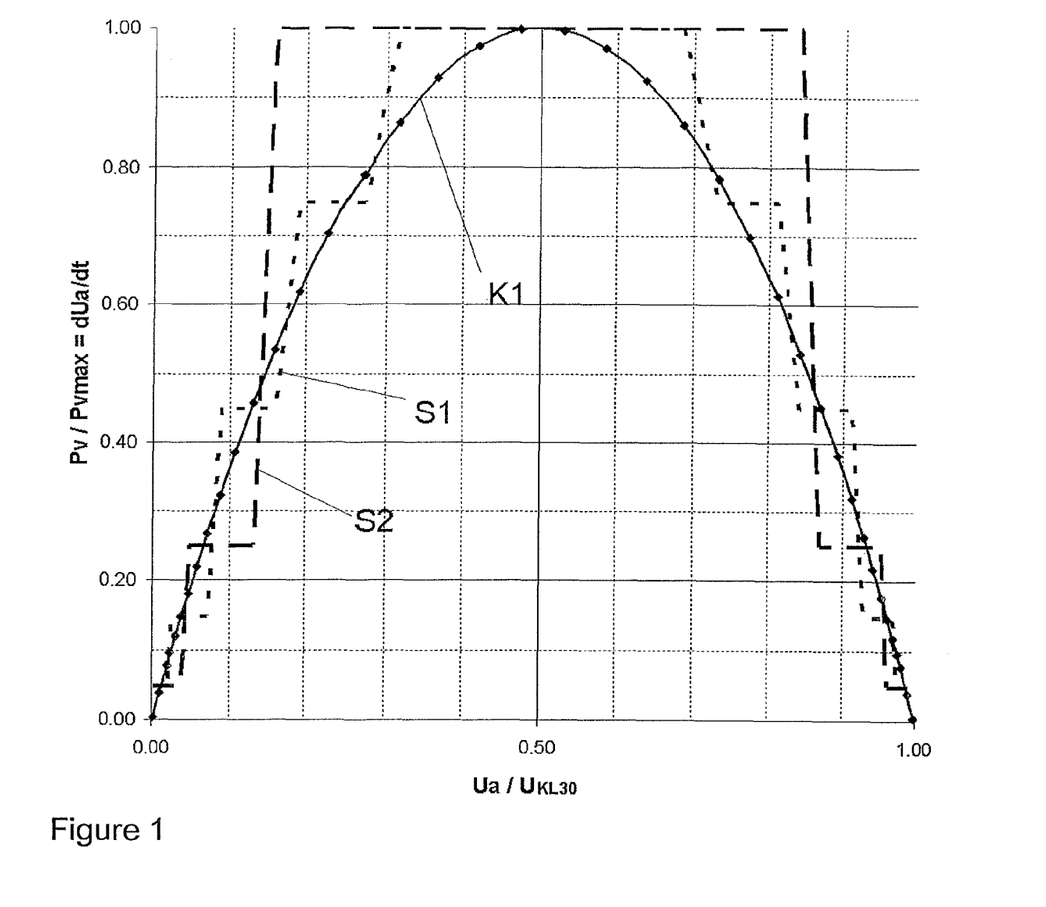
FIG. 1: shows the relative power loss in dependence on the relative output voltage with a linear load element, shown in a right-handed coordinate system, wherein the right-hand abscissa axis is the relative output voltage $U_a/U_{KL30}$ and the upward ordinate axis is the relative power loss $P_V/P_{V\,max}$.

In the new methods, for example according to WO2005/057788, the switching speed of the switching element is varying in dependence on the instantaneous power loss. FIG. 1 shows the normalized power loss in a switching element when driving an ohmic load element (linear load element) as well as a stepped convergence of the course of the rate of change of the output voltage according to WO2005/057788.

However, such methods, as disclosed in said application, fail when driving load elements that show a non-linear behaviour within a switching process (load elements with a non-linear voltage-current interrelationship, such as LEDs).

Figure 5:
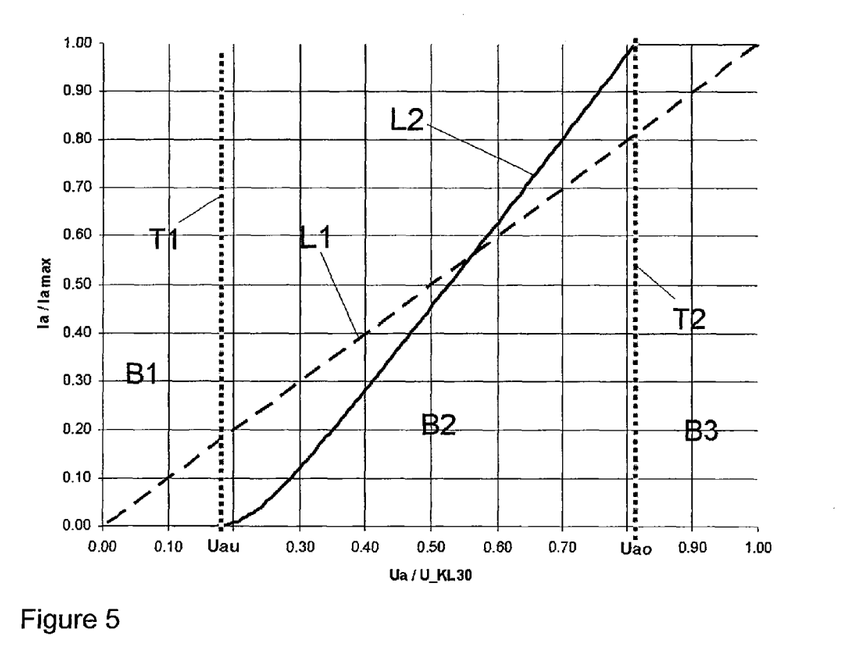
FIG. 5: shows the course of the normalized current-voltage characteristic of a linear and of a non-linear load element, wherein the maximum current with this non-linear load element has an upper limit, shown in a right-handed coordinate system, wherein the right-hand abscissa axis is the relative output voltage $U_a/U_{KL30}$ and the upward ordinate axis is the relative load current $I_a/I_{a\,max}$.

On account of the non-linear interrelationship between the voltage and the current in the load element, the power loss in the switching element is not linearly dependent on the output voltage or the load current, respectively. Therefore, when driving the non-linear load elements, an adjustment of the switching speed of the switching element that is only related to the power loss or output voltage at the switching element or to a quantity depending thereon is not applicable without being confronted with increased switching losses or a bad electromagnetic radiation, respectively. This difference between linear and non-linear load elements is illustrated in FIG. 5, for example. With an ideal linear load element (e.g. linear resistor), the current changes proportionally to the voltage at the load element (see dashed line L1 in FIG. 6). Thus, with a linear load element, there is a quadric-polynomial interrelationship between the power loss $P_V$ at the switching element and the output voltage $U_a$: $P_V \sim (U_a)^2$, i.e. the power loss $P_V$ is linearly proportional to the square of the output voltage $U_a$, as shown in FIG. 1 (see continuous polynomial curve).

Figure 2:
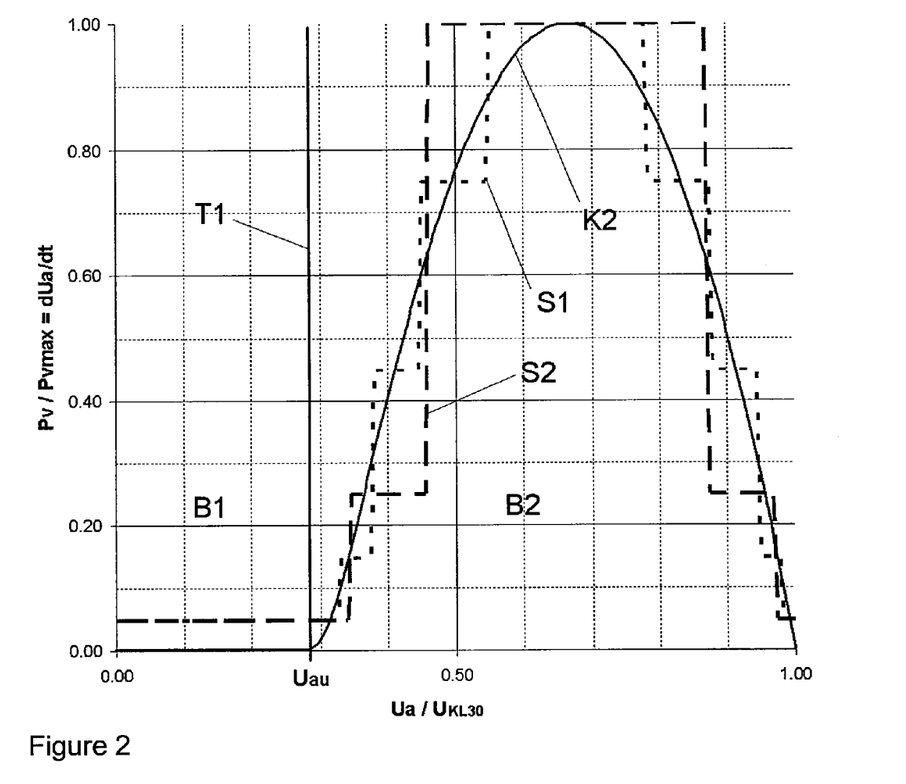
FIG. 2: shows the relative power loss in dependence on the relative output voltage with a non-linear load element, shown in a right-handed coordinate system, wherein the right-hand abscissa axis is the relative output voltage $U_a/U_{KL30}$ and the upward ordinate axis is the relative power loss $P_V/P_{V\,max}$.
Figure 6:
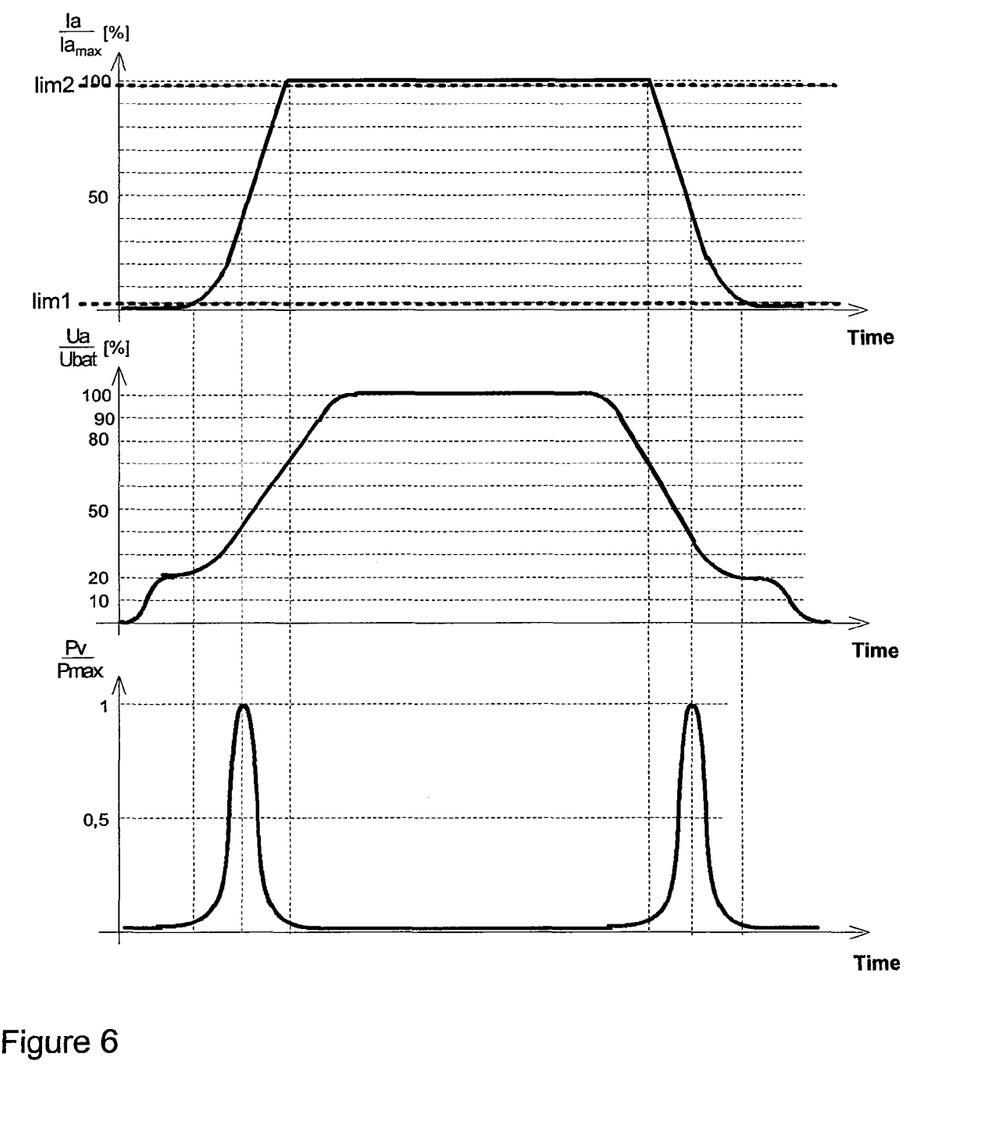
FIG. 6: shows the variations in time/the switching behaviour of the relative power loss, of the relative load current and of the relative output voltage with a non-linear load element, wherein the maximum current with this load element is limited according to FIG. 5, shown in three right-handed coordinate systems, wherein the first coordinate system shows the variation in time of the relative load current $I_a/I_{a\,max}$, the second coordinate system shows the variation in time of the relative output voltage $U_a/U_{bat}$, and the third coordinate system shows the variation in time of the relative power loss $P_V/P_{V-max}$.
Figure 8:
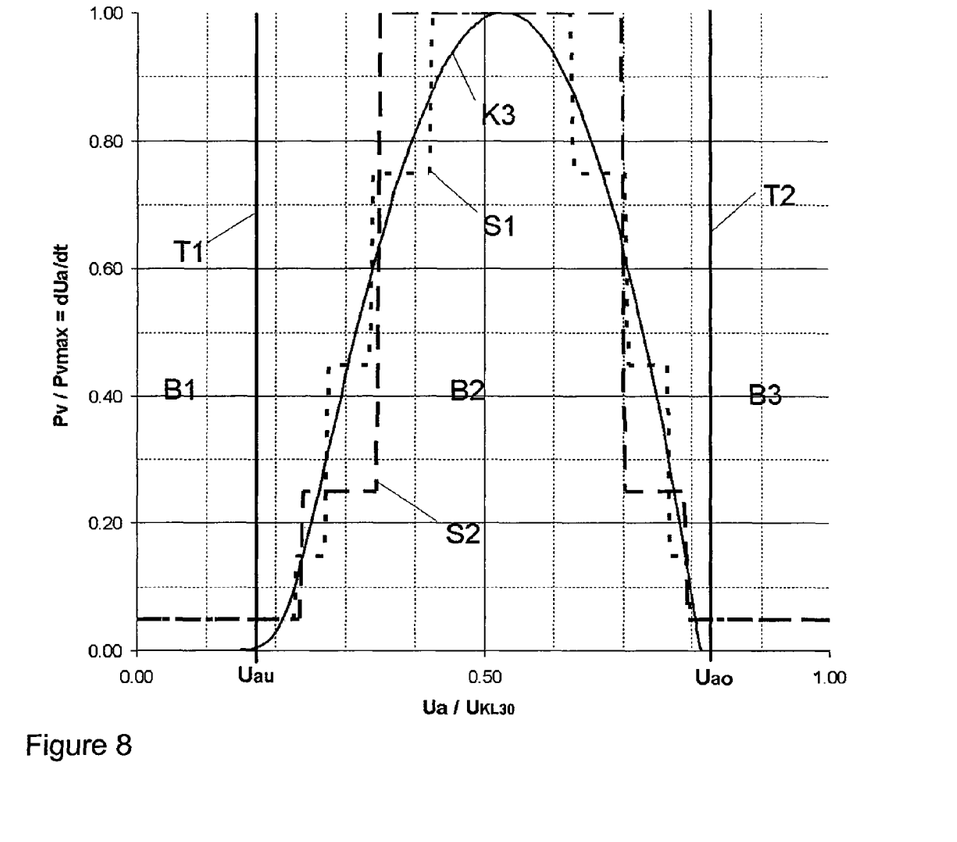
FIG. 8: shows the relative power loss in dependence on the relative output voltage with a non-linear load element with the current limitation according to FIG. 5, shown in a right-handed coordinate system, wherein the right-hand abscissa axis is the relative output voltage $U_a/U_{bat}$ and the upward ordinate axis is the relative power loss $P_V/P_{V\,max}$.

On the other hand, with a non-linear load element, the current flowing in this non-linear load element does not change proportionally to the output voltage (see continuous line L2 in FIG. 6). Therefore, there is no linear interrelationship between the power loss and the current or the voltage, respectively. This is illustrated in FIGS. 2 and 8, wherein FIG. 2 shows a non-linear interrelationship in the L-range of the output voltage and FIG. 8 a non-linear interrelationship both in the L-range and in the H-range of the output voltage. As a result of the non-linear interrelationship between the voltage and the current, an adjustment of the switching speed only on the basis of the power loss or the output voltage is not practicable with the non-linear load elements, which means that the radiation of electromagnetic noise fields cannot be reduced effectively by means of the method according to WO2005/057788.

SUMMARY OF THE INVENTION

It is therefore object of the present invention to set forth a method of the abovementioned type, by means of which the radiated electromagnetic fields with the non-linear load elements can be reduced effectively by means of a load-dependent, active influencing of the switching edges of the switching device and the valid standards can be met.

On account of the non-linear interrelationship between the voltage and the current at the load element and the related non-linear dependence of the power loss on the quantities "voltage" and "current", an adjustment of the switching speed only on the basis of the power loss or the voltage, respectively, cannot be carried out with non-linear load elements without being confronted with undesirable switching losses and related electromagnetic noise fields.

Therefore, according to aspects of the invention, the load current currently flowing in the load element is picked up in addition to the currently determined power loss at the switching element, and the switching speed of the non-linear load elements is controlled in dependence on the determined power loss and on the measured load current.

By including the current flowing in the load element as a further measured quantity in addition to the quantity "power loss", the switching speed of the non-linear load elements can be optimally adjusted, wherein the switching speed of the non-linear switching element is controlled as follows:

the switching speed is set high in the range where the current-voltage characteristic of the load element $dI_a/dU_a$ is approximately zero;

the switching speed is set high in the range where the current-voltage characteristic of the load element $dI_a/dU_a$ is not approximately zero and the power loss is high; and the switching speed is set low in the range where the current-voltage characteristic of the load element $dI_a/dU_a$ is not approximately zero and the power loss is low.

The present invention is based on an active influencing of the switching speed of the switching element in such a manner that the switching element is operated at a high switching speed in that range where both the output voltage and the current in the load element have exceeded the respective lower threshold. Accordingly, the switching element is operated at a reduced switching speed when the output voltage and the current in the load element are below the respective threshold.

For optimally adjusting the switching speed, two thresholds each are used for the power loss at the switching element and for the load current. For the power loss, the output voltage is picked up as a measured quantity, and two voltage thresholds are used as a reference quantity for the output voltage.

BRIEF DESCRIPTION OF THE DRAWINGS

In the following, the invention will be explained in greater detail on the basis of the exemplary embodiments and with the aid of the figures in which

FIG. 10b: shows the variation in time of the relative load current $I_a/I_{a\,max}$ with the associated pulse duration for the switching behaviour according to Table 1 and FIG. 10a;

DETAILED DESCRIPTION OF THE INVENTION

FIG. 1 shows the change of the relative power loss $P_V/P_{V\,max}$ in dependence on the relative output voltage $U_a/U_{KL30}$ with a linear load element, wherein $P_V$ is the instantaneous power loss, $P_{V\,max}$ is the maximum power loss, $U_a$ is the output voltage, and $U_{KL30}$ is the supply voltage. According to that, the relative power loss $P_V/P_{V-max}$ shows a quadric polynomial of the output voltage $U_a/U_{KL30}$, which is a result of the linear interrelationship between the output voltage $U_a$ and the current $I_a$ in a linear load element.

FIGS. 2 and 8, on the other hand, show a non-linear interrelationship between the power loss $P_V$ and the output voltage $U_a$ in a non-linear load element. This non-linear interrelationship between the power loss $P_V$ and the output voltage $U_a$ is a result of the non-linear interrelationship between the output voltage $U_a$ and the current $I_a$ in the load element, which is the case with a non-linear load element. Consequently, such a non-linear load element, such as an LED (light emitting diode), cannot be operated by means of a method as described in WO2005/057788 without causing increased interfering radiation or increased switching losses.

As shown in FIG. 2, the curve of the relative power loss $P_V/P_{V-max}$ has a range (range B1 in the figure) where the power loss $P_V$ is zero in spite of the increasing output voltage $U_a$. Outside this range B1, in range B2, the relative power loss $P_V/P_{V31\ max}$ shows an approximately linear interrelationship with the relative output voltage $U_a/U_{KL30}$. The transition point between these two ranges B1 and B2 is the lower voltage threshold $U_{au}$ of the output voltage $U_a$ that is still to be determined.

Since the voltage threshold $U_{au}$ of the LED is not exactly known or is varying in dependence on the operational conditions, the current currently flowing in the load element (load current $I_a$) is introduced as a new physical measured quantity as against the known method according to WO2005/057788. Also, a current threshold $I_{lim1}$ is introduced for the currently flowing load current $I_a$.

Figure 3:
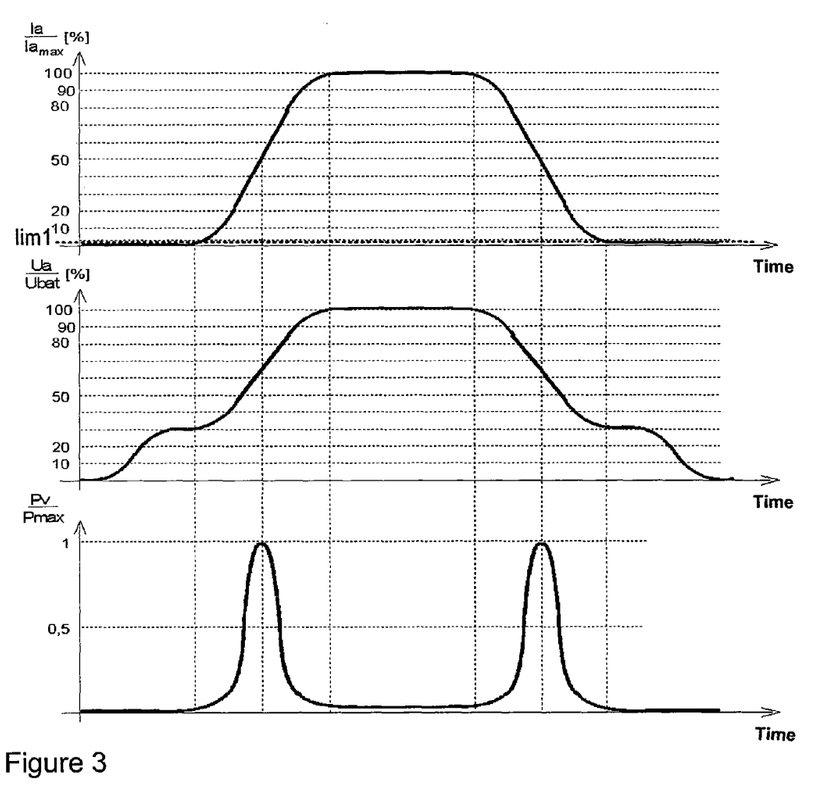
FIG. 3: shows the variations in time/the switching behaviour of the relative power loss, of the relative load current and of the relative output voltage with a non-linear load element according to FIG. 2, shown in three right-handed coordinate systems, wherein the first coordinate system shows the variation in time of the relative load current $I_a/I_{a\,max}$, the second coordinate system shows the variation in time of the relative output voltage $U_a/U_{bat}$, and the third coordinate system shows the variation in time of the relative power loss $P_V/P_{V-max}$.

So, the switching element is operated at a high switching speed in that range where both the output voltage $U_a$ and the load current $I_a$ have exceeded the lower thresholds $U_{au}$ and $I_{lim1}$, respectively. Accordingly, the switching speed is reduced when the output voltage $U_a$ and the load current $I_a$ are below the thresholds $U_{au}$ and $I_{lim1}$, respectively. The variations in time are illustrated in FIG. 3. The range of high power loss is dependent on the voltage threshold $U_{au}$ of the LED.

FIG. 2 shows the basic course of the relative power loss $P_V/P_{V31\ max}$ in the switching element. As in the method that is already known, the switching speed is adjusted to the instantaneous value of the power loss $P_V$, wherein the dashed curves S1 and S2 represent a stepped convergence of the switching speed to the ideal curve with different numbers of steps, whereby the emitted spectrum can be reduced in the high-frequency ranges also for non-linear load elements without significantly increasing the switching losses.

Figure 4:
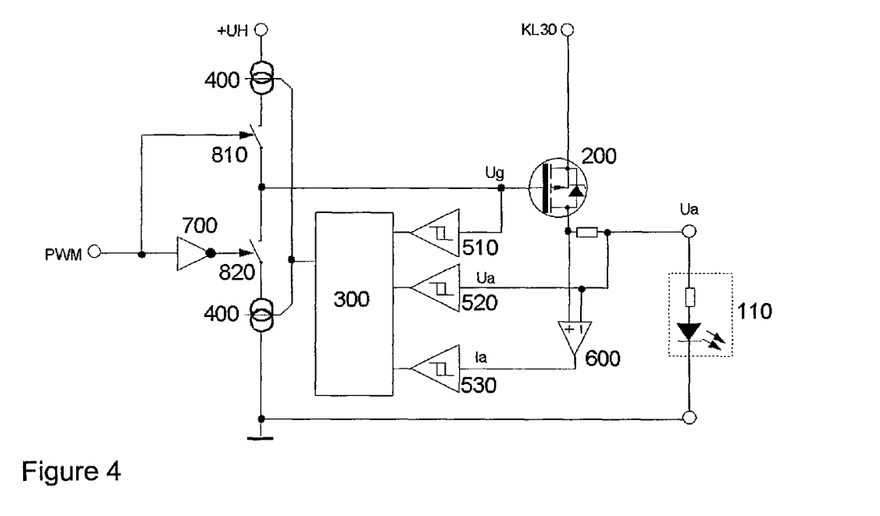
FIG. 4: shows an equivalent circuit diagram of a circuit arrangement for carrying out the method according to FIG. 3.

FIG. 4 shows a possible realization of this switching process according to FIG. 3 with a circuit arrangement. As the non-linear load element, an LED with a series resistor 110 is shown. In this circuit arrangement, when switching, the gate of the MOSFET switching element 200 is supplied with currents of varying amperage in dependence on the power loss $P_V$, namely the output voltage $U_a$, and on the load current $I_a$, and so the switching speed, within the switching process, is specifically adjusted to the instantaneous values of the measured quantities power loss $P_V$/output voltage $U_a$ and load current $I_a$.

The switching speed is set high in the range of high power loss $P_V$ and in the range of small change $dI_a/dU_a$ of the load current $I_a$ compared to the change of the output voltage $U_a$. The switching speed is set low in the range of low power loss $P_V$ and of great change $dI_a/dU_a$ of the load current $I_a$ compared to the change of the output voltage $U_a$.

By means of the controllable power sources 400 and corresponding control logic 300, the transitions between the high and the low switching speeds can be preset very precisely and, if necessary, a very fine adjustment of the switching speed be realized. The functioning of the control logic 300 is illustrated in Tables 1 and 2.

In order to extend the service life of the LEDs and/or to control the brightness/the colour spectrum independently of the supply voltage, it is also usual to operate LEDs in series with power sources 120 for current limitation. The continuous line L2 in FIG. 5 shows an exemplary course of the normalized current-voltage characteristic of such a load element. When driving such a load element, current limitation results in the following variations in time as in FIG. 6. The shown variations in time illustrate that the spectrum of the current includes considerable high-frequency portions. These portions can be reduced by reducing the switching speed shortly before reaching the threshold current of the current limitation.

Since the current threshold of the current limitation is not exactly known or is varying in dependence on the operational conditions, this current threshold has to be determined for the next falling/rising edge during operation, unless the course of the current has already been rounded off in the load element, wherein the lower current threshold $I_{lim1}$ is a quantity that is dependent on the maximum current of the switching element and/or on the instantaneous load.

Figure 7:
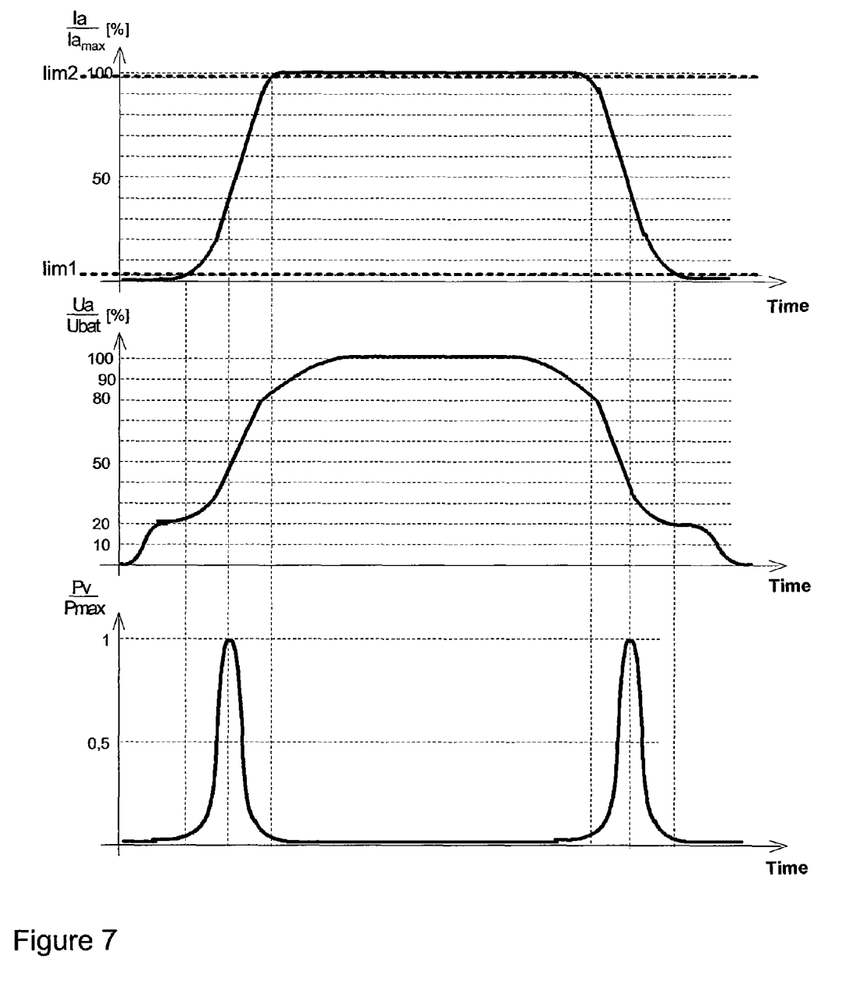
FIG. 7: shows the variations in time/the switching behaviour of the relative power loss, of the relative load current and of the relative output voltage with a non-linear load element according to FIG. 8 with the current limitation according to FIG. 5, shown in three right-handed coordinate systems, wherein the first coordinate system shows the variation in time of the relative load current $I_a/I_{a\,max}$, the second coordinate system shows the variation in time of the relative output voltage $U_a/U_{bat}$, and the third coordinate system shows the variation in time of the relative power loss $P_V/P_{V-max}$.

In addition to the lower current threshold $I_{lim1}$ already described, an upper current threshold $I_{lim2}$ is defined so that the switching element is operated at a high switching speed only when the current in the load element has fallen below this upper current threshold $I_{lim2}$. Accordingly, the switching speed is reduced when the current $I_a$ in the load element has exceeded the upper current threshold $I_{lim2}$. The difference $\Delta I$ between the current threshold and the maximum current $I_{max}$ in the load element is defined absolutely or with reference to the maximum current $I_{max}$. The variations in time are illustrated in FIG. 7.

The range of high power loss is dependent on the current threshold $I_{lim2}$ of the current limitation as well as on the voltage threshold $U_{ao}$ of the LED. FIG. 8 shows the basic course of the relative power loss in the switching element.

The threshold may be defined in advance or during operation. For determining the upper current threshold $I_{lim2}$ during operation, the maximum value $I_{max}$ of the current is first determined, for example by means of a so-called peak detector or by single or multiple sampling of the current, said sampling being synchronous with the PWM signal. From this maximum value $I_{max}$, the current threshold $I_{lim2}$ is then determined, as described above, and preferably continuously compared with the instantaneous load current $I_a$.

However, those periods of time during switching in which the current is almost constant may negatively influence the pulse-pause ratio so that the pulse-pause ratio of driving deviates from that of the load current $I_a$. As a countermeasure, a further sample-and-hold element may be used for measuring, synchronously with the upper current threshold $I_{lim2}$ of the load current $I_a$, the associated voltage value at the load element. In dependence thereon, the upper voltage threshold $U_{ao}$ may be defined above this voltage value, above which the switching speed is increased in order to improve the correspondence between the set pulse-duty factor and the actual pulse-duty factor by reducing the dead times. In addition to that, the maximum value of the voltage of the load element of the same pulse or the voltage value occurring simultaneously with the maximum current, respectively, is determined and compared with the lower voltage threshold $U_{ao}$. In dependence on the difference between the two values, the associated upper voltage threshold $U_{ao}$ and the current threshold $I_{lim2}$ are accepted as valid values or rejected in order to prevent that wrong thresholds are adopted when the current limitation is not reached on account of a low supply voltage.

Accordingly, when the lower current threshold $I_{lim1}$ is reached, the associated voltage value at the load element may be measured and the lower voltage threshold $U_{au}$ be defined just below it, below which the switching speed is increased as well.

At the beginning, the thresholds $U_{au}$, $U_{ao}$, $I_{lim1}$, $I_{lim2}$ are fixed at the respective expected value or its minimum or maximum value, respectively.

Figure 9:
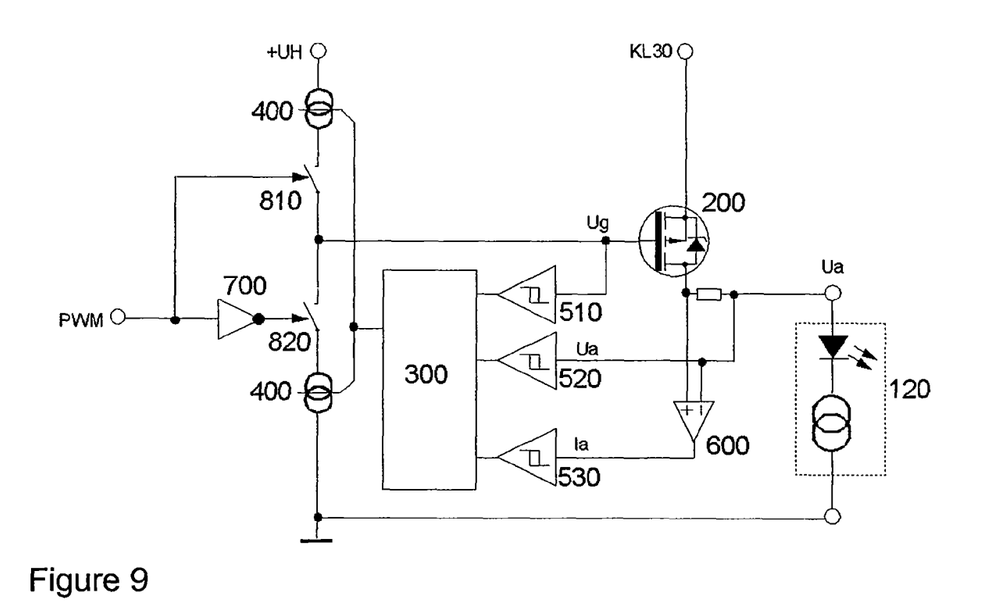
FIG. 9: shows an equivalent circuit diagram of a circuit arrangement for carrying out the method according to FIG. 7.

FIG. 9 shows an equivalent circuit diagram of a circuit arrangement for carrying out the method for adjusting the switching behaviour according to FIG. 7.

Figure 10A:
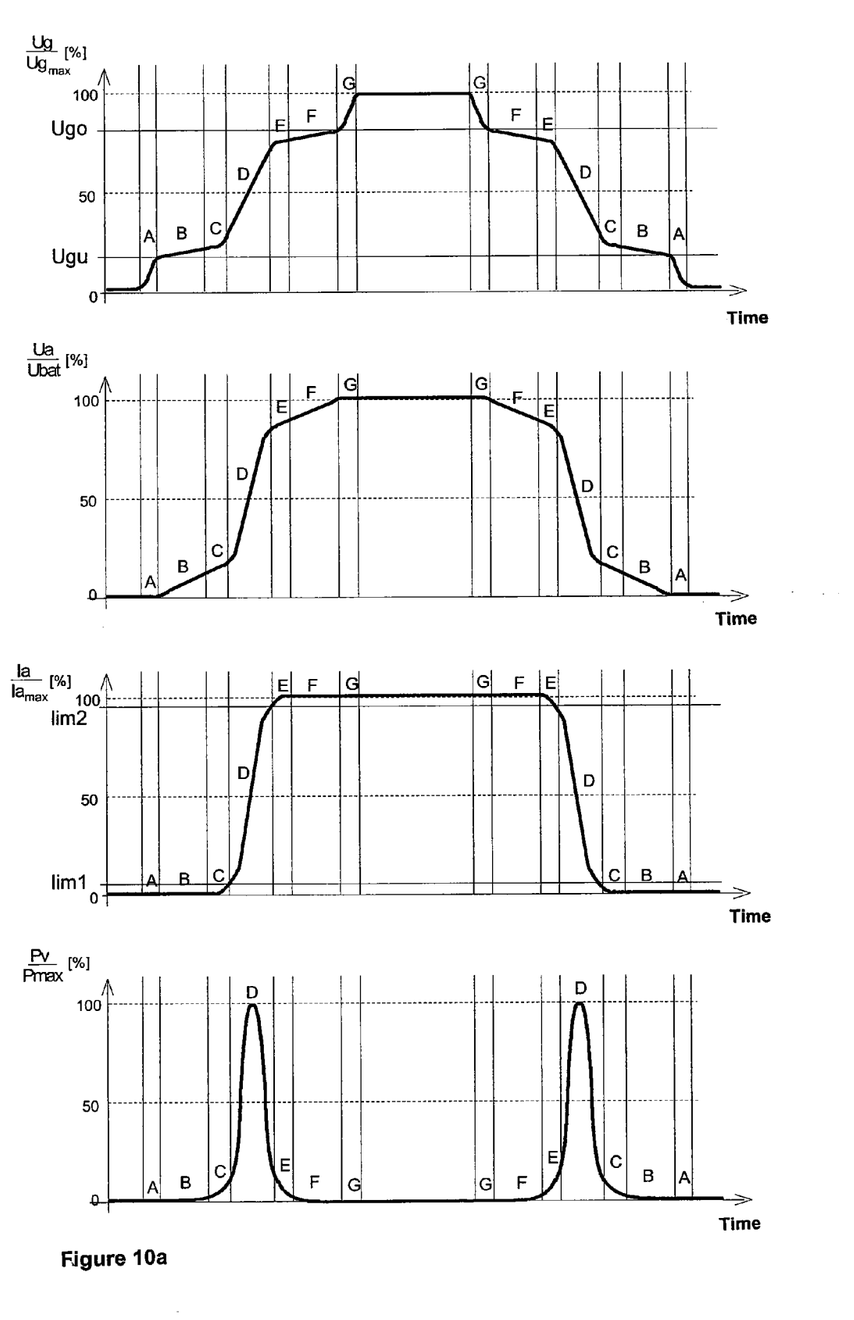
FIG. 10a: shows the switching behaviours in an inventive method for adjusting the switching speed of the switching element when driving a non-linear load element, with a course of the relative power loss relative to the relative output voltage according to FIG. 8 according to Table 1, shown in four right-handed coordinate systems, wherein the first coordinate system shows the variation in time of the relative gate voltage $U_g/U_{g\,max}$, the second coordinate system shows the variation in time of the relative output voltage $U_a/U_{bat}$, the third coordinate system shows the variation in time of the relative load current $I_a/I_{a\,max}$, and the fourth coordinate system shows the variation in time of the relative power loss $P_V/P_{V-max}$.
Figure 10B:
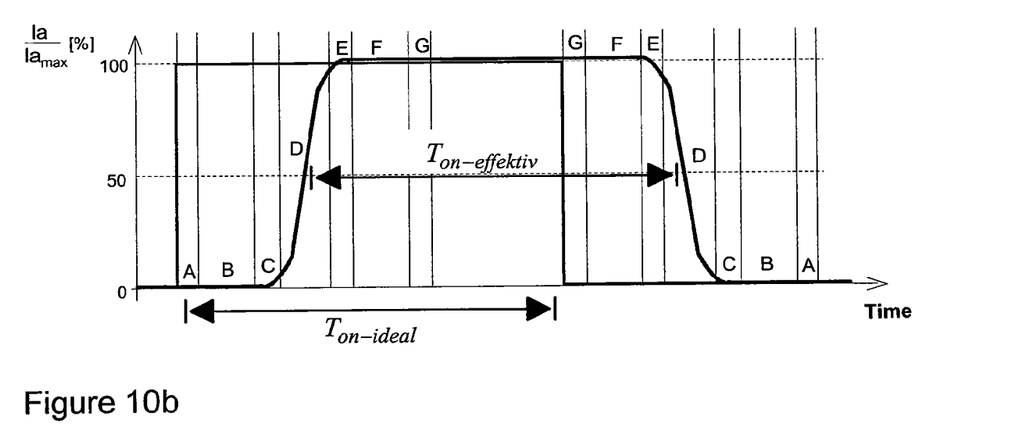
Figure 10C:
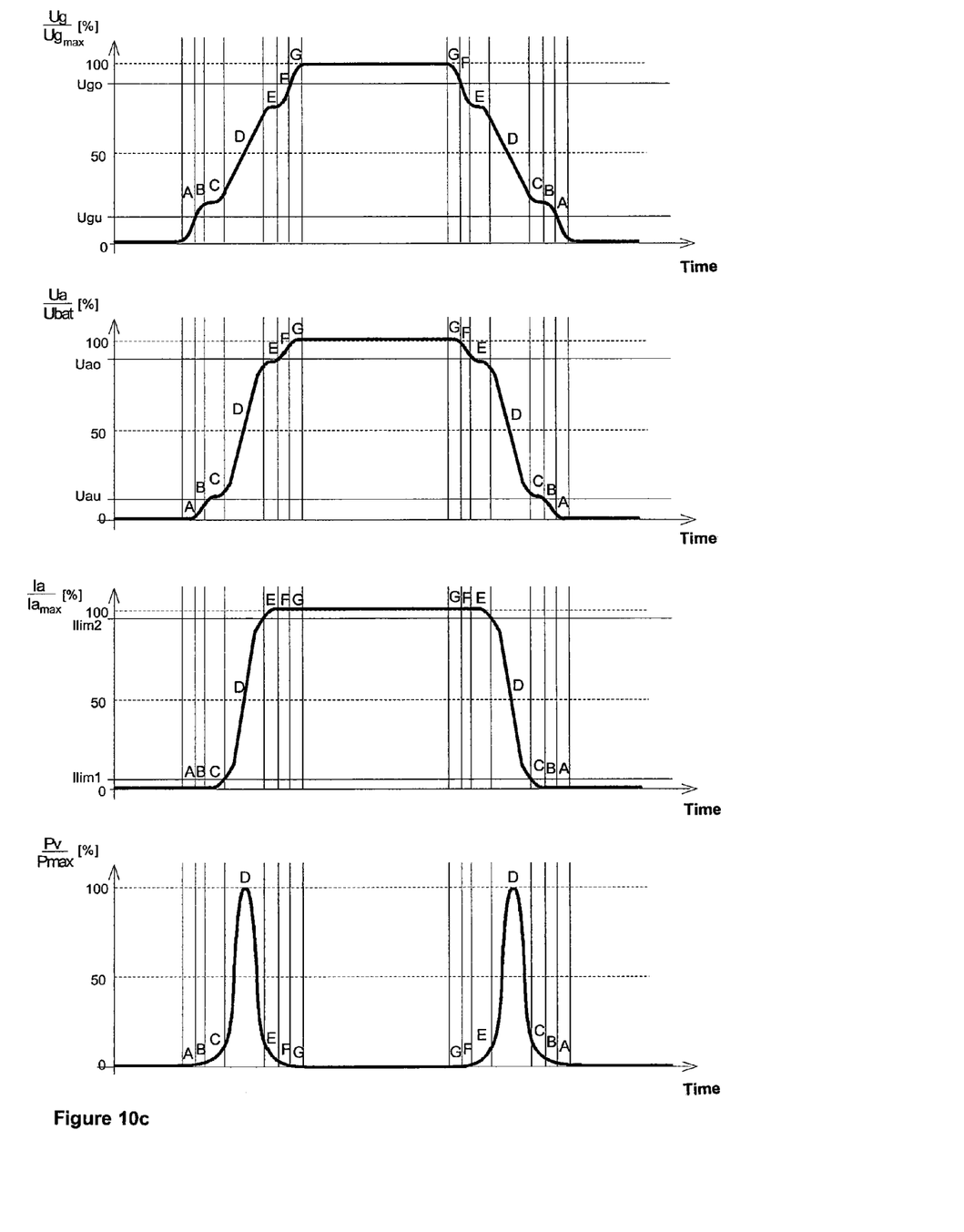
FIG. 10c: shows the switching behaviours in an inventive method for adjusting the switching speed of the switching element when driving a non-linear load element, with a course of the relative power loss relative to the relative output voltage according to FIG. 8 according to Table 2, shown in four right-handed coordinate systems, wherein the first coordinate system shows the variation in time of the relative gate voltage $U_g/U_{g\,max}$, the second coordinate system shows the variation in time of the relative output voltage $U_a/U_{bat}$, the third coordinate system shows the variation in time of the relative load current $I_a/I_{a\,max}$, and the fourth coordinate system shows the variation in time of the relative power loss $P_V/P_{V-max}$.

FIGS. 10a, 10b, 10c show the detailed switching behaviour in an inventive method for adjusting the switching speed in a non-linear load element, with a course of the relative power loss relative to the relative output voltage according to FIG. 8.

FIG. 10a shows the switching behaviour as shown in Table 1.

TABLE 1

| Range | Gate voltage: $U_g$ | Output current: I | Switching speed | Power loss in this range |
|---|---|---|---|---|
| A | $U_g < U_{gu}$ | $I < I_{lim1}$ | High | Low |
| B, C | $U_{gu} < U_g < U_{go}$ | $I < I_{lim1}$ | Low | Low |
| D | $U_{gu} < U_g < U_{go}$ | $I_{lim1} < I < I_{lim2}$ | High | High |
| E, F | $U_{gu} < U_g < U_{go}$ | $I > I_{lim2}$ | Low | Low |
| G | $U_g > U_{go}$ | $I > I_{lim2}$ | High | Low |

Table 1 and FIG. 10a show a first case, wherein the switching speed is set low in ranges B and F. Here, particularly with the transitions between B and C and between E and F, the thresholds $U_{au}$ and $U_{ao}$ are not used yet.

FIG. 10b shows the course of the current with the associated pulse duration for the switching behaviour according to Table 1 and FIG. 10a, and also the idealized course of the current for driving without pulse shaping and the pulse duration thereof.

It is obvious that the correspondence between the two pulse durations, and thus the duty cycle faithfulness, depends on the symmetry of ranges A, B, C with ranges G, F, E. The difference between the pulse durations results from the difference between the duration of ranges E, F, G and the duration of ranges A, B, C:

$$\Delta T_{on} = T_{on\text{-}effektiv} - T_{on\text{-}ideal} = t_E + t_F + t_G - t_A - t_B - t_C$$

Since $t_F$, the duration of range F, depends on the supply voltage and thus does not have to be constant for a short period of time during operation, this may cause interfering variations of brightness.

For this reason, the switching speed is to be increased in ranges B and F, as it has been done for ranges A and G for the same reason. The result of this is a further improved switching behaviour (see Table 2 and FIG. 10c). According to that, the reduction of the times $t_B$ and $t_F$ also reduces their influence on the error of the pulse duration $\Delta T_{on}$. Here, the thresholds $U_{gu}$ and $U_{go}$ are not used any more. They are replaced by the thresholds $U_{au}$ and $U_{ao}$, respectively.

TABLE 2

| Range | Output voltage: $U_a$ | Output current: I | Switching speed | Power loss in this range |
|---|---|---|---|---|
| A | $U_a < U_{au}$ | $I < I_{lim1}$ | High | Low |
| B | $U_a < U_{au}$ | $I < I_{lim1}$ | High | Low |
| C | $U_{au} < U_a < U_{ao}$ | $I < I_{lim1}$ | Low | Low |
| D | $U_{au} < U_a < U_{ao}$ | $I_{lim1} < I < I_{lim2}$ | High | High |
| E | $U_{au} < U_a < U_{ao}$ | $I > I_{lim2}$ | Low | Low |
| F | $U_a > U_{ao}$ | $I > I_{lim2}$ | High | Low |
| G | $U_a > U_{ao}$ | $I > I_{lim2}$ | High | Low |

The switching element is operated at a high switching speed only when the current in the load element has exceeded a lower current threshold $I_{lim1}$, as it is the case in range D.

Accordingly, the switching speed is reduced when the current in the load element is below the lower current threshold $I_{lim1}$, as at the transition from range D to range C.

The upper current threshold $I_{lim2}$ cannot be preset for changing loads or for loads where a change in temperature, for example, results in a variation of the current limitation of the load element. This threshold has to be determined during operation and can then be assumed as being temporarily constant.

For determining this current threshold $I_{lim2}$ during operation, the maximum current $I_{max}$ of a previous pulse is determined, and so the threshold $I_{lim2}$ has to be just below this maximum value:

$$I_{lim2} = I_{max} - \Delta I.$$

$\Delta I$ may be a fixed value or a percentage value $\delta$. If it is a percentage value $\delta$, the upper current threshold $I_{lim2}$ is determined as follows:

$$I_{lim2} = (1-\delta) \times I_{max}.$$

If the load element is an LED with a series resistor without current limitation as in FIG. 4, the value $I_{max}$ changes almost linearly with the supply voltage $U_{bat}$. However, since the supply voltage $U_{bat}$ can be measured continuously, it is more useful not to select the current threshold $I_{lim2}$, but to select a threshold $U_{a2}$ (not $U_{au}$ or $U_{ao}$) with reference to the output voltage $U_a$ that depends on the supply voltage. $U_{a2}$ is selected as follows:

$$U_{a2} = U_{KL30} - R_{DS\text{-}on} \times I - \Delta U,$$

with $U_{bat}$: supply voltage, $R_{DS\text{-}on} \times I$: voltage drop at switching element, $\Delta U$: fixed value, or percentage value relative to supply voltage.

On account of the small voltage drop at the switching element, also $U_{a2}$ may be indicated as a percentage value:

$$U_{a2} = (1-\delta) \times U_{KL30}$$

The lower voltage threshold $U_{au}$ is determined as follows. The current threshold $I_{lim1}$ is already known. During the cycle of a pulse, the output voltage $U_a$ and the current I are sampled simultaneously. At the point in time $t_1$, the current I reaches the lower current threshold: $I(t_1)=I_{lim1}$. At the same point in time, the output voltage $U_a$ reaches the value $U_a(t_1)$. The voltage threshold $U_{au}$ is fixed just below this value $U_a(t_1)$: $U_{au}=U_a(t_1) \Delta U_1$. When fixing the magnitude of $\Delta U_1$, it has to be taken into consideration that the current I is still or already almost zero at the lower voltage threshold $U_{au}$.

Similarly, the upper voltage threshold $U_{ao}$ is determined as follows. The upper current threshold $I_{lim2}$ is already known. During the cycle of a pulse, the output voltage $U_a$ and the current I are sampled simultaneously. At the point in time $t_2$, the current reaches the upper current threshold: $I(t_2)=I_{lim2}$. At the same point in time, the output voltage $U_a$ reaches the value $U_a(t_2)$. The voltage threshold $U_{ao}$ is fixed just above this value $U_a(t_2)$: $U_{ao}=U_a(t_2)+\Delta U_2$. When fixing the magnitude of $\Delta U_2$, it has to be taken into consideration that the current I is still or already almost the maximum value $I_{max}$ at the upper voltage threshold $U_{ao}$.

| List of reference numerals | |
|---|---|
| 110 | Light emitting diode (LED) in series with series resistor |
| 120 | Light emitting diode in series with power source |
| 200 | MOSFET switching element |
| 300 | Control logic |
| 400 | Controllable power source |
| 510, 520, 530 | Schmitt trigger, comparator |
| 600 | Comparator |
| 700 | Inverter |
| 810, 820 | Switch |
| K1 | Relative power loss $P_V/P_{V\text{-}max}$ as a function of the relative output voltage $U_a/U_{KL30}$ with a linear load element |
| K2 | Relative power loss $P_V/P_{V\text{-}max}$ as a function of the relative output voltage $U_a/U_{KL30}$ with a non-linear load element |
| K3 | Relative power loss $P_V/P_{V\text{-}max}$ as a function of the relative output voltage $U_a/U_{KL30}$ with a non-linear load element, wherein the maximum load current has an upper limit |
| S1, S2 | Stepped convergence of the switching speed to the ideal curve K1, K2 and K3, respectively, with different numbers of steps |
| B1 | Range where the power loss $P_V$ is zero in spite of the increasing output voltage $U_a$ |
| B2 | Range where the relative power loss $P_V/P_{V\text{-}max}$ shows an approximately linear interrelationship with the relative output voltage $U_a/U_{KL30}$ |
| B3 | Range where the load current $I_a$ is limited by the power source the light emitting diode 120 is connected in series with |
| T1 | Separating line between ranges B1 and B2 |
| T2 | Separating line between ranges B2 and B3 |
| L1 | Normalized current-voltage characteristic of a linear load element |
| L2 | Normalized current-voltage characteristic of a light emitting diode 120 that is operated in series with a power source |
| A, B, C, D, E, F, G | Individual range in the switching process |

The invention claimed is:

1. Method for driving a non-linear load element,
wherein an output voltage ($U_a$) at the non-linear load element, and a load current ($I_a$) currently flowing through the non-linear load element is measured, and an instantaneous switching speed is controlled in dependence on the load current ($I_a$),
wherein a) a lower voltage threshold $U_{au}$ is determined when the load current $I_a$ flowing through the non-linear load element exceeds a predefined current value and b) an upper voltage threshold $U_{ao}$ is determined when the load current $I_a$ flowing through the non-linear load element reaches a maximum current value, and
wherein the instantaneous switching speed is controlled when the output voltage is between the lower voltage threshold $U_{au}$ and the upper voltage threshold $U_{ao}$ such that the switching speed is set: a) at a first speed when an instantaneous power loss is greater than a threshold, and b) at a second speed that is lower than the first speed when the instantaneous power loss is less than or equal to the threshold.

2. Method according to claim 1, wherein during the switching, the load current ($I_a$) currently flowing in the load element is picked up continuously.

3. Method according to claim 1, wherein during the switching, both the instantaneous power loss and the load current ($I_a$) currently flowing in the load element are picked up continuously.

4. Method according to claim 1, wherein the method is a method for driving a load element for the pulse-width modulated driving of a load element with a non-linear interrelationship between the voltage and the current by means of an electronic switching element in the load circuit.

5. Method according to claim 4, wherein during the switching, an instantaneous output voltage at the load element and/or an instantaneous voltage at a gate of the switching element as well as the load current ($I_a$) currently flowing in the load element are picked up several times and the instantaneous switching speed is controlled in dependence on the instantaneous output voltage ($U_a$) at the load element and/or the instantaneous voltage ($U_g$) at the gate of the switching element and on the load current ($I_a$).

6. Method according to claim 1, wherein the switching speed is set high in the range where a ratio (dI/dU) of the load current ($I_a$) to the output voltage ($U_a$) is approximately zero.

7. Method according to claim 1, wherein the switching speed is set high in a range where a ratio (dI/dU) of the load current ($I_a$) to the output voltage ($U_a$) is not approximately zero and a power loss is high.

8. Method according to claim 1, wherein the switching speed is set low in a range where a ratio (dI/dU) of the load current ($I_a$) to the output voltage ($U_a$) is not approximately zero, but a power loss is low.

9. Method according to claim 1, wherein at least two current thresholds ($I_{lim1}$ and $I_{lim2}$) are provided for the load current ($I_a$).

10. Method according to claim 9, wherein at least two voltage thresholds ($U_{au}$ and $U_{ao}$) are provided for the output voltage ($U_a$).

11. Method according to claim 10, wherein the voltage thresholds ($U_{au}$ and $U_{ao}$) for the output voltage ($U_a$) are determined in dependence on the thresholds ($I_{lim1}$ and $I_{lim2}$) of the load current ($I_a$).

12. Method according to claim 10, wherein a maximum value ($I_{max}$) of the load current ($I_a$) is picked up during a pulse and one or more upper thresholds ($U_{ao}$, $I_{lim2}$) are determined in dependence thereon, and a currently flowing load current ($I_a$) is compared with the thresholds ($U_{ao}$, $I_{lim2}$) and the switching speed is controlled in dependence thereon.

13. Method according to claim 1, wherein the driving is carried out in such a manner that, in a range of high power loss, the output voltage ($U_a$) is adjusted to a maximally preset switching speed and the switching speed at a beginning and at an end of the switching is lower than a maximum switching speed.

14. Method according to claim 10, wherein a voltage value of the load element occurring simultaneously with the lower threshold ($I_{lim1}$) of the load current ($I_a$) is determined and a lower voltage threshold ($U_{au}$) is defined in dependence thereon and the switching speed is controlled in dependence thereon so that the switching speed below this voltage threshold ($U_{au}$) is higher than a minimally preset switching speed.

15. Method according to claim 12, wherein a voltage value of the load element associated with the maximum current ($I_{max}$) is determined and an upper voltage threshold ($U_{ao}$) is defined in dependence thereon and the switching speed is controlled in dependence thereon so that the switching speed above the upper voltage threshold ($U_{ao}$) is higher than a minimally preset switching speed.

16. Method according to claim 12, wherein the maximum value of the voltage of the load element, or a voltage value that occurs simultaneously with the maximum current ($I_{max}$), is determined and compared with the voltage threshold ($U_{ao}$) that occurs in a same pulse and depends on the maximum current ($I_{max}$) and, in dependence on a difference therebetween, the voltage threshold ($U_{ao}$) and/or the current threshold ($I_{lim2}$) that depends on the maximum current ($I_{max}$) is/are adopted or rejected.

17. Device for driving a non-linear load element, including:
control logic that measures an output voltage $U_a$ at the non-linear load element, and a load current $I_a$ currently flowing through the non-linear load element, and controls an instantaneous switching speed in dependence on the load current ($I_a$) and an instantaneous power loss ($P_v$),
wherein a) a lower voltage threshold $U_{au}$ is determined when the load current $I_a$ flowing through the non-linear load element exceeds a predefined current value and b) an upper voltage threshold $U_{ao}$ is determined when the load current $I_a$ flowing through the non-linear load element reaches a maximum current value, and
wherein the instantaneous switching speed is controlled when the output voltage is between the lower voltage threshold $U_{au}$ and the upper voltage threshold $U_{ao}$ such that the switching speed is set: a) at a first speed when an instantaneous power loss is greater than a threshold, and b) at a second speed that is lower than the first speed when the instantaneous power loss is less than or equal to the threshold.

18. Device of claim 17, wherein the device is configured for pulse-width modulated driving of a load element with a non-linear interrelationship between a voltage and a current by an electronic switching element in the load circuit.

19. Device of claim 17, wherein during the switching, the load current ($I_a$) currently flowing in the load element is picked up continuously.

20. Device of claim 17, wherein during the switching, said means pick up both the instantaneous power loss ($P_V$) and the load current ($I_a$) currently flowing in the load element several times.

21. Device of claim 17, wherein during the switching, said means pick up both the instantaneous power loss (PV) and the load current (Ia) currently flowing in the load element continuously.

* * * * *